(12) United States Patent
Eckel et al.

(10) Patent No.: US 10,243,357 B2
(45) Date of Patent: Mar. 26, 2019

(54) APPARATUS AND METHOD FOR SWITCHING A DIRECT CURRENT

(71) Applicant: SIEMENS AKTIENGESELLSCHAFT, Munich (DE)

(72) Inventors: Hans-Guenter Eckel, Rostock (DE); Dominik Ergin, Baiersdorf (DE); Herbert Gambach, Uttenreuth (DE); Hans-Joachim Knaak, Erlangen (DE); Andreas Philipp, Winkelhaid (DE); Hubert Schierling, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 241 days.

(21) Appl. No.: 15/105,746

(22) PCT Filed: Dec. 20, 2013

(86) PCT No.: PCT/EP2013/077775
§ 371 (c)(1),
(2) Date: Jun. 17, 2016

(87) PCT Pub. No.: WO2015/090464
PCT Pub. Date: Jun. 25, 2015

(65) Prior Publication Data
US 2016/0315467 A1 Oct. 27, 2016

(51) Int. Cl.
*H02H 9/04* (2006.01)
*G01R 31/08* (2006.01)
(Continued)

(52) U.S. Cl.
CPC ............ *H02H 9/045* (2013.01); *G01R 31/085* (2013.01); *H01H 33/38* (2013.01);
(Continued)

(58) Field of Classification Search
CPC .... G01R 31/085; H01H 33/38; H01H 33/596; H01H 33/72; H01H 9/42;
(Continued)

(56) References Cited

U.S. PATENT DOCUMENTS

| 5,737,162 A * | 4/1998 | Ito | H01H 33/596 361/13 |
| 8,717,716 B2 * | 5/2014 | Hafner | H01H 9/542 361/8 |
| 8,817,445 B1 * | 8/2014 | Lundquist | H01C 7/12 361/117 |
| 8,884,176 B2 * | 11/2014 | Juhlin | H01H 33/596 218/143 |

(Continued)

FOREIGN PATENT DOCUMENTS

| CN | 102656656 A | 9/2012 |
| CN | 102870181 A | 1/2013 |

(Continued)

*Primary Examiner* — Thienvu Tran
*Assistant Examiner* — Nicolas Bellido
(74) *Attorney, Agent, or Firm* — Laurence Greenberg; Werner Stemer; Ralph Locher

(57) ABSTRACT

An apparatus switches a direct current in a high-voltage line. The apparatus contains a multiplicity of switching units, which are arranged so as to form a series circuit in the high-voltage line. Each switching unit in this case contains a switching element and a surge arrester arranged in a parallel circuit with the switching element, the threshold voltage of the surge arrester being higher than a rated voltage of the switching element. A sum of the rated voltages of the switching elements corresponds at least to an operating voltage of the high-voltage line. The switching elements are mechanical switches, and each mechanical switch contains a contact arrangement having two disconnectable contact pieces and is configured to build up an arcing voltage on disconnection of the contact pieces with a magnitude which is higher than the rated voltage of the mechanical switch.

10 Claims, 3 Drawing Sheets

(51) Int. Cl.
*H01H 33/59* (2006.01)
*H01H 33/72* (2006.01)
*H01H 33/38* (2006.01)
*H01H 9/42* (2006.01)

(52) U.S. Cl.
CPC .......... *H01H 33/596* (2013.01); *H01H 33/72* (2013.01); *H01H 9/42* (2013.01)

(58) Field of Classification Search
CPC ............. H01H 2009/543; H01H 9/548; H01H 2009/544; H01H 9/542; H01H 9/541; H01H 2009/0083; H01H 33/161; H01H 89/00; H01H 9/167; H01H 2009/546; H01H 33/02; H01H 33/125; H01H 33/14; H01H 33/143; H01H 33/59; H01H 33/66; H01H 33/75; H01H 71/10; H01H 71/24; H01H 9/30; H01H 9/54; H01H 9/56; H02H 9/045; H02H 3/025; H02H 3/08; H02H 3/087; H02H 9/025; H02H 7/1257; H02H 3/02; H02H 3/021; H02H 3/20; H02H 3/202; H02H 3/22; H02H 3/38; H02H 7/268; H02H 9/005; H02H 9/02
See application file for complete search history.

(56) References Cited

U.S. PATENT DOCUMENTS

| | | | |
|---|---|---|---|
| 9,208,979 | B2 | 12/2015 | Haefner et al. |
| 10,096,989 | B2* | 10/2018 | Lee ............... H01H 9/54 |
| 2011/0175460 | A1* | 7/2011 | Astrom ............ H01H 33/596 |
| | | | 307/112 |
| 2012/0234796 | A1 | 9/2012 | Juhlin |
| 2013/0038975 | A1 | 2/2013 | Häfner et al. |
| 2013/0278078 | A1* | 10/2013 | Ohlsson ............ H01H 9/548 |
| | | | 307/113 |
| 2014/0005053 | A1* | 1/2014 | Schacherer ........ H01F 38/023 |
| | | | 505/211 |
| 2016/0006236 | A1 | 1/2016 | Tang et al. |

FOREIGN PATENT DOCUMENTS

| | | |
|---|---|---|
| CN | 103117528 A | 5/2013 |
| CN | 103227557 A | 7/2013 |
| CN | 103280763 A | 9/2013 |
| CN | 103403830 A | 11/2013 |
| FR | 2496333 A1 | 6/1982 |
| JP | 2004288478 A * | 10/2004 |
| WO | 2011050832 A1 | 5/2011 |
| WO | 2011141054 A1 | 11/2011 |

* cited by examiner

APPARATUS AND METHOD FOR SWITCHING A DIRECT CURRENT

BACKGROUND OF THE INVENTION

Field of the Invention:

The invention relates to an apparatus for switching a direct current in a high-voltage line with a large number of switching units which are arranged to form a series circuit in the high-voltage line. Each switching unit in this case comprises a switching element as well as a surge arrester arranged in a circuit parallel with the switching element, the threshold voltage of said surge arrester being greater than a rated voltage of the switching element, wherein the sum of the rated voltages of the switching elements corresponds to at least an operating voltage of the high-voltage line.

High voltage refers in this context to voltage potential differences of at least 10 kV, for example with respect to ground potential.

An apparatus of this sort is known from WO 2011/141054 A1. The switching elements according to WO 2011/141054 A1 are semiconductor switches. In order to keep the forward conduction losses that arise in the apparatus during a normal operation as low as possible, a further switching unit which comprises a mechanical switch is arranged in series with the switching units with the semiconductor switches. In normal operation, the current flows through the mechanical switch, whose losses are small in comparison with those of the semiconductor switches. When the known apparatus is switched off, the semiconductor switches are switched off first, after which the mechanical switch can be triggered and the current in the high-voltage line interrupted.

The known apparatus is provided for use in a high-voltage line that can have an operating voltage with a magnitude of up to several hundred kilovolts. For that reason, the known apparatus must comprise a large number of semiconductor switches which first limit the current, so that the mechanical switch can be triggered. A large number of semiconductor switches, however, results in losses in the apparatus that are still high. The switching time of the apparatus also lengthens when the semiconductor switches and the mechanical switch operate in temporal sequence. The use of semiconductor switches, furthermore, leads to high manufacturing costs for the apparatus.

BRIEF SUMMARY OF THE INVENTION

On the basis of the prior art, the object of the invention consists in proposing an apparatus of this general type that is economical and which permits a reduction in the forward conduction losses.

The object is achieved in that the switching elements of the apparatus are mechanical switches, wherein each mechanical switch comprises a contact arrangement with two separable contact pieces and is designed to develop an arcing voltage when the contact pieces are separated, the magnitude of which is greater than the rated voltage of the mechanical switch.

The rated voltage of the mechanical switch here refers to the voltage that the mechanical switch can permanently insulate. Usually, the mechanical switch is in addition able to briefly insulate transient voltage surges in the high-voltage line that are above the rated voltage.

If the current in the high-voltage line is to be switched, for example in the event of a fault, the mechanical switches are switched, wherein the contact pieces are separated. This usually leads to the formation of an arc between the separated contact pieces. The mechanical switch of the apparatus according to the invention is designed to develop an arcing voltage whose magnitude is greater than the rated voltage thereof. Because of this capability, the mechanical switch is able in total to develop an opposing voltage that is greater than the reverse voltage of the high-voltage line or of the DC network. In this way, the current in each of the switching units is commuted from the mechanical switch to the parallel branch with the surge arresters, and the arc extinguishes. The threshold voltage of the surge arresters lies in each case above the rated voltage of the mechanical switch, so that the total current through the apparatus can be limited to a negligible residual current through the surge arresters. Further, through commuting the current to the surge arresters, a re-ignition of individual arcs that can occur as a result of different extinguishing moments, is prevented. The surge arrester furthermore relieves the mechanical switch in that the energy stored inductively in the high-voltage line is partially absorbed by the surge arrester, and does not have to be totally absorbed by the individual arcs. This reduces the stress on the mechanical switches.

One advantage of the apparatus according to the invention is that in normal operation the current in the high-voltage line flows through the mechanical switches, and the losses that arise thereby are smaller than they are with corresponding semiconductor switches. As a result, the operating costs of a DC network comprising the high-voltage line are reduced.

Through the use of mechanical switches connected in series, the switching time can, moreover, be shortened in comparison with the use of a single mechanical switch with an isolation gap that is necessarily long.

An arc forms when two contacts in free air that are under voltage are separated, its arcing voltage being around 20 V for each centimeter of arc. With the available maximum separation distance between the contact pieces of a few centimeters, this voltage is not enough to develop an adequate arcing voltage to extinguish the arc. An increase in the arcing voltage can, for example, be achieved through cooling, for example by means of a gas or oil flowing around the contact pieces. Preferably the mechanical switches each comprise at least one arc-extinguishing chamber 12 to develop the arcing voltage. The arc-extinguishing chamber 12 can here comprise a plurality of extinguishing plates arranged parallel to one another. The arc burning between the contact pieces can be driven, for example by means of electromagnetic blowing, in the direction of the extinguishing plates, so that the arc is divided into partial arcs burning between the extinguishing plates. The arcing voltage can be significantly increased in this way.

According to one embodiment of the invention at least one trigger unit is provided to trigger the switch. The trigger unit initiates the separation of the contact pieces of the mechanical switch, for example using electromechanical forces, as is, for example, implemented in typical commercial high-speed rail circuit breakers. High-speed rail circuit breakers from rail applications that incorporate fast triggering allowing the contact pieces to be separated within a few milliseconds, preferably less than 10 ms, particularly preferably less than 5 ms, appear particularly suitable here. Typical high-speed rail circuit breakers used here have a rated voltage of 4 kV and a rated DC current of 5 kA. The apparatus can, for example, comprise between 50 and 200 such high-speed rail circuit breakers arranged in series.

Preferably the apparatus comprises at least one control apparatus for driving the at least one trigger unit 11. If the apparatus according to the invention comprises a plurality of trigger units 11, the control apparatus preferably is designed to drive the trigger units 11 individually. In this way the mechanical switches can, for example, be triggered in a predefined sequence, but not simultaneously. The reverse voltage in the apparatus as a whole can thus be adjusted in steps. This allows a current rate-of-change of a fault current to be adjusted variably.

Preferably the rated voltage of the mechanical switches is between 1 kV and 20 kV.

According to a further advantageous form of embodiment of the apparatus according to the invention, the surge arresters are metal oxide varistors. These varistors differ from other varistors, for example silicon carbide varistors, in the particularly advantageous form of the characteristic current-voltage curve.

According to a further form of embodiment of the apparatus according to the invention, the apparatus comprises an isolating switch for interrupting the direct current. The isolating switch is here arranged in series with the switching units. The isolating switch is designed to interrupt the high-voltage line and thus to remove voltage as soon as the mechanical switches have opened and the arcs have extinguished.

The switching units of the apparatus according to the invention preferably further each comprise an inductor 10 that limits the current rise and is arranged in series with the mechanical switch.

Preferably the apparatus according to the invention comprises a measuring device 9 for detecting a fault current in the high-voltage line. The measuring device 9 is connected to the control apparatus. The measuring device 9 can, for example, be provided in order to detect or to determine the current and/or the current rise in the high-voltage line. The measuring device 9 can, according to the detected measured data, generate an output signal that can be passed to the control apparatus, so that the control apparatus can convert the output signal of the measuring device 9 into corresponding control signals.

The invention furthermore relates to a method for switching the direct current in a high-voltage line, and addresses the task of configuring such a method such that it can be carried out economically with low forward conduction losses.

The object is achieved according to the invention by a method in which mechanical switches arranged in a series circuit are triggered, wherein an arcing voltage is developed in each mechanical switch, the magnitude of which is greater than a rated voltage of the mechanical switch, so that the current in a parallel branch arranged in parallel with each mechanical switch is commuted with at least one surge arrester, whose threshold voltage is greater than the rated voltage of the mechanical switch.

One advantage of the method according to the invention is that in normal operation the current in the high-voltage line flows through the mechanical switches, and the losses arising here are smaller than with corresponding semiconductor switches. As a result, operating costs of a DC network comprising the high-voltage line can be reduced.

The triggering of the mechanical switches carried out essentially in parallel advantageously permits a limitation of the switching time. Each of the mechanical switches can switch within a few milliseconds, and the development of the required arcing voltage also requires only a few milliseconds. A fast and reliable switching of currents in high-voltage lines is achieved through this.

Exemplary embodiments of the invention are explained in more detail below with reference to FIGS. 1 and 2.

BRIEF DESCRIPTION OF THE SEVERAL VIEW OF THE DRAWING

DESCRIPTION OF THE INVENTION

Figure 1:
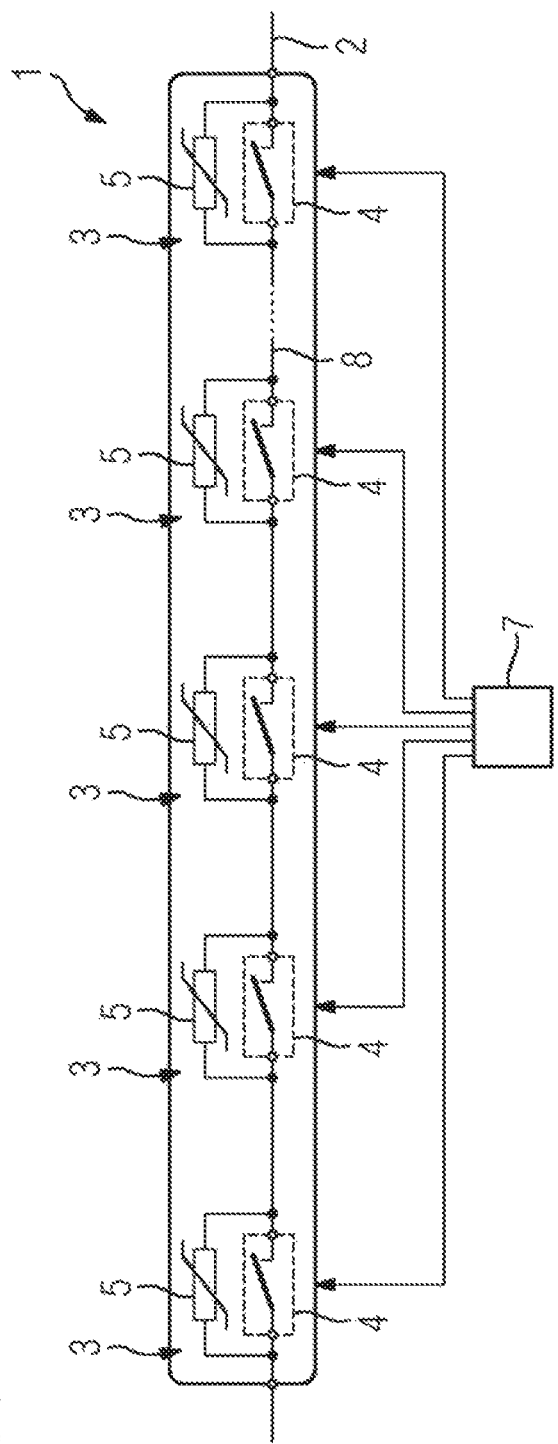
FIG. 1 shows a schematic illustration of a first exemplary embodiment of an apparatus according to the invention.

In detail, FIG. 1 shows an apparatus 1 for switching a direct current in a high-voltage line 2. The apparatus 1 comprises a series circuit of switching units 3 connected in series. Each switching unit 3 comprises a switching element which is a mechanical switch 4. In the schematic illustration of FIG. 1, five switching units 3 with five mechanical switches 4 are explicitly graphically illustrated. A broken line section 8, however, indicates that the apparatus 1 comprises additional further switching units. The number of the switching units 3 depends on the operating voltage in the high-voltage line 2 and on the rated voltages of the mechanical switches 4. Each switching unit 3 furthermore comprises a metal oxide varistor 5 which is arranged in a branch parallel to the mechanical switch 4.

If a fault current in the high-voltage line 2 is detected by means of a measuring device, not illustrated graphically in FIG. 1, a control apparatus 7 generates control signals that trigger the mechanical switches 4. Each mechanical switch 4 has mechanical contact pieces that are separated from one another when triggered. An arc then develops between the mechanical contact pieces of each mechanical switch 4. To generate an arcing voltage that is greater than the rated voltage of the mechanical switches 4, the arc in the exemplary embodiment illustrated is driven over special extinguishing plates that are arranged in the mechanical switches 4. As soon as the sum of the arcing voltages in the mechanical switches 4 corresponds to at least the operating voltage of the high-voltage line 2, the current in each of the mechanical switches 4 is commuted onto the parallel branch with the varistors 5. Since the threshold voltage of the varistors 5 is greater than the rated voltage of the mechanical switches 4, the current as a whole is limited to a small residual current that can be neglected.

Figure 2:
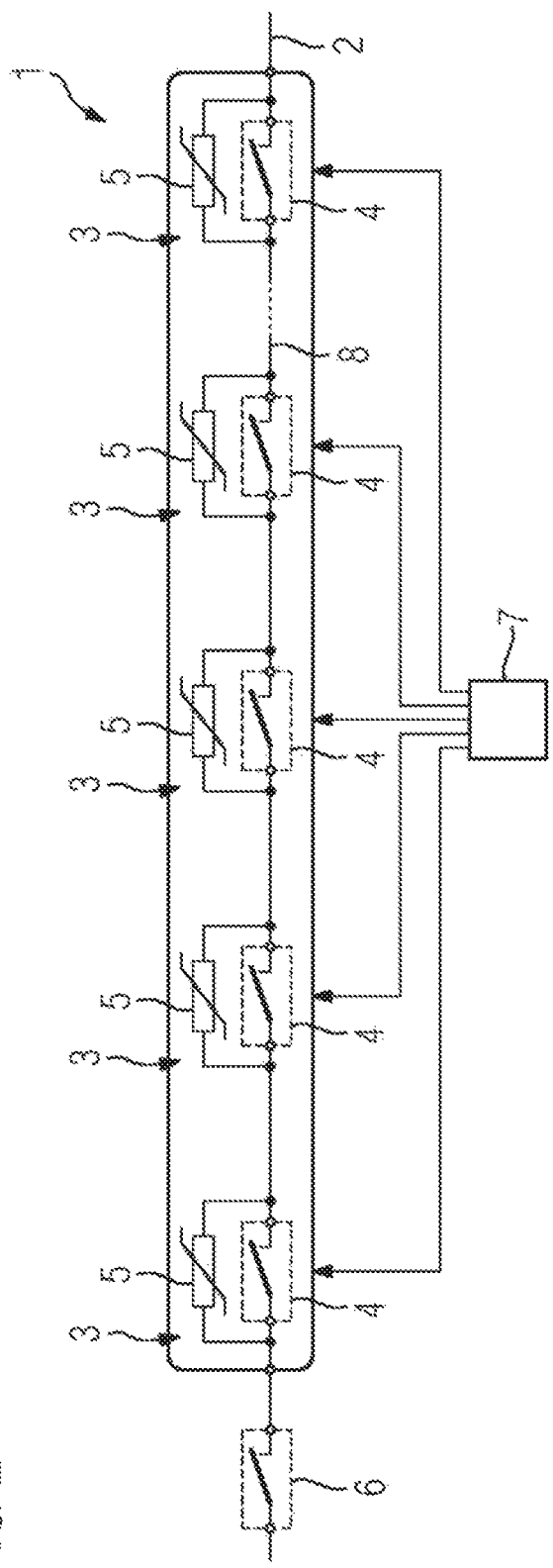
FIG. 2 shows a schematic illustration of a second exemplary embodiment of the apparatus according to the invention.
Figure 3:
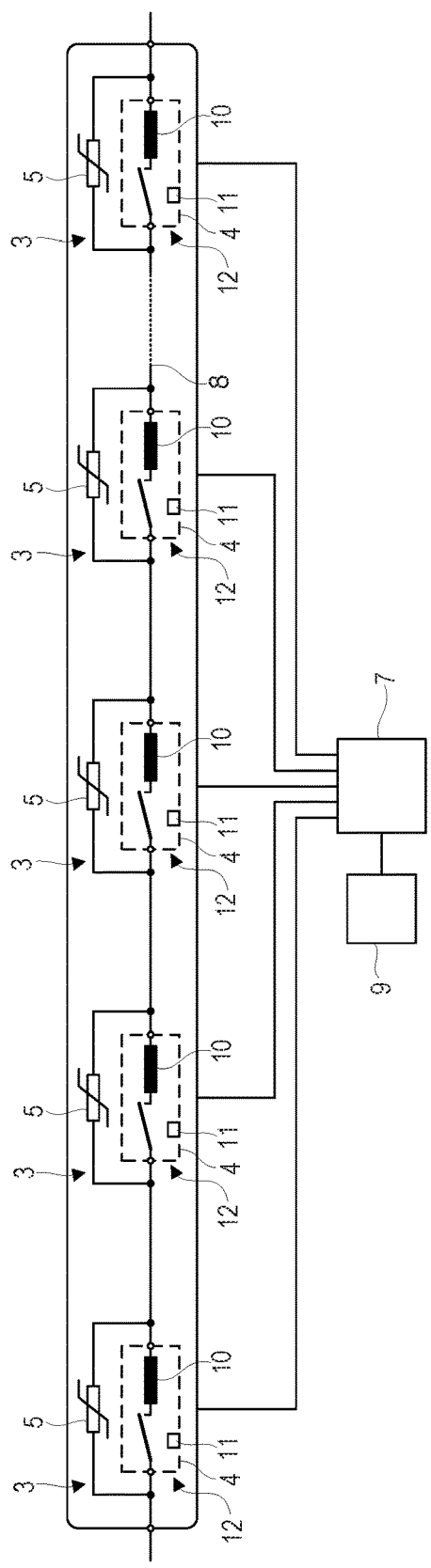

FIG. 2 illustrates a second exemplary embodiment of the apparatus according to the invention. Parts that are identical and are the same type each have the same reference signs in FIGS. 1 and 2. For the avoidance of repetition, therefore, only those elements that distinguish the exemplary embodiment of FIG. 2 from the exemplary embodiment of FIG. 1 are considered in the description of FIG. 2.

An apparatus 11 according to the exemplary embodiment of FIG. 2 differs from the apparatus 1 according to the exemplary embodiment of FIG. 1, in that a further isolating switch 6 is arranged in series with the series circuit of the switching units 3. As soon as the current in the apparatus 11 has been limited to the residual current, the isolating switch 6 can interrupt the current in the high-voltage line 2 and thus completely switch off the high-voltage line 2.

TABLE OF REFERENCE SIGNS 1, 11 Apparatus for switching a direct current
2 High-voltage line
3 Switching unit
4 Switching element
5 Surge arrester 6 Isolating switch
7 Control apparatus
8 Line section

The invention claimed is:

1. An apparatus for switching a direct current in a high-voltage line, the apparatus comprising:
a number of switching units disposed to form a series circuit in the high-voltage line, each of said switching units having a switching element and a surge arrester disposed in parallel with said switching element, said surge arrester having a threshold voltage being greater than a rated voltage of said switching element, and a sum of rated voltages of said switching elements corresponds to at least an operating voltage of the high-voltage line, said switching element is a mechanical switch having a contact configuration with two separable contact pieces and is configured to develop an arcing voltage when said contact pieces are separated, a magnitude of said arcing voltage being greater than the rated voltage of said mechanical switch.

2. The apparatus according to claim 1, wherein said mechanical switch contains at least one arc-extinguishing chamber to develop the arcing voltage.

3. The apparatus according to claim 1, further comprising at least one electromagnetic trigger unit for triggering said mechanical switch.

4. The apparatus according to claim 3, further comprising at least one controller for driving said at least one electromagnetic trigger unit.

5. The apparatus according to claim 1, wherein the rated voltage of said mechanical switch is between 1 kV and 20 kV.

6. The apparatus according to claim 1, wherein said surge arrester is a metal oxide varistor.

7. The apparatus according to claim 1, further comprising an isolating switch for interrupting the direct current and disposed in series with said switching units.

8. The apparatus according to claim 1, wherein each of said switching units has an inductor that limits a current rise and is disposed in series with said mechanical switch.

9. The apparatus according to claim 4, further comprising a a fault current meter for detecting a fault current in the high-voltage line, and said measuring device is connected to said controller.

10. A method for switching a direct current in a high-voltage line, which comprises the steps of:
providing a plurality of mechanical switches disposed in a series circuit in the high-voltage line; and
triggering the mechanical switches when an arcing voltage is developed in each mechanical switch, a magnitude of the arcing voltage being greater than a rated voltage of a mechanical switch, so that a current in a parallel branch disposed in parallel with each mechanical switch is commuted with at least one surge arrester having a threshold voltage being greater than a rated voltage of the mechanical switch.

* * * * *